United States Patent
Broekaert et al.

(10) Patent No.: US 7,230,476 B1
(45) Date of Patent: Jun. 12, 2007

(54) BIPOLAR HIGH IMPEDANCE ELEMENT

(75) Inventors: Tom Peter Edward Broekaert, Thousand Oaks, CA (US); Michael Case, Thousand Oaks, CA (US)

(73) Assignee: Inphi Corporation, Westlake Village, CA (US)

( * ) Notice: Subject to any disclaimer, the term of this patent is extended or adjusted under 35 U.S.C. 154(b) by 234 days.

(21) Appl. No.: 11/039,468

(22) Filed: Jan. 18, 2005

(51) Int. Cl.
*H03B 1/00* (2006.01)

(52) U.S. Cl. ..................... 327/552; 327/558

(58) Field of Classification Search ............... 327/493, 327/504, 551, 552, 556, 557, 558, 559
See application file for complete search history.

(56) References Cited

U.S. PATENT DOCUMENTS

| | | | | |
|---|---|---|---|---|
| 4,392,068 A | * | 7/1983 | Welles, II | 327/44 |
| 4,430,626 A | * | 2/1984 | Adams | 331/108 B |
| 4,509,019 A | * | 4/1985 | Banu et al. | 330/107 |
| 4,780,690 A | * | 10/1988 | Voorman | 330/294 |
| 4,994,774 A | * | 2/1991 | Joosse | 333/172 |
| 5,451,852 A | * | 9/1995 | Gusakov | 318/611 |
| 6,137,351 A | * | 10/2000 | Alderman et al. | 327/563 |
| 6,753,725 B2 | * | 6/2004 | Grundy | 327/558 |
| 6,977,541 B2 | * | 12/2005 | Kurose et al. | 327/552 |

\* cited by examiner

*Primary Examiner*—Jeffrey Zweizig
(74) *Attorney, Agent, or Firm*—Koppel, Patrick, Heybl & Dawson (57) ABSTRACT

A bipolar high impedance element comprises a p-n diode made from a compound semiconductor, and circuitry arranged to reverse-bias the diode such that the diode conducts a nearly constant current—thereby enabling the element to be employed as a high impedance element. The diode is preferably the base-emitter junction of a transistor made from a compound semiconductor like InP, such that an on-chip high impedance element is provided for a fabrication process such as that used for HBTs. The element is suitably employed in an active low pass filter design: the element is connected between an input signal and an op amp input, and a feedback capacitor is connected between the op amp's output and input. The resulting filter's time constant varies with the reverse-biased diode's impedance and the capacitance of the feedback capacitor.

22 Claims, 5 Drawing Sheets

BIPOLAR HIGH IMPEDANCE ELEMENT

BACKGROUND OF THE INVENTION

1. Field of the Invention

This invention relates to the field of high impedance elements, and particularly to circuits and methods for providing on-chip high impedance elements in a limited die area.

2. Description of the Related Art

Analog integrated circuits (ICs) often have a need for a high impedance element. For example, many filter designs require an R-C network, the components of which are sized to provide a desired time constant. However, when a large time constant is needed, the size of one or more of the components may exceed the available on-chip area, thereby requiring the use of an external capacitor and/or resistor. The use of off-chip components is undesirable, however, due to their added cost and space requirements.

The number of on-chip elements available to an IC designer typically depends on the IC's particular fabrication process. For example, a particular "HBT" process—which employs a compound semiconductor material such as indium phosphide (InP) to fabricate heterojunction bipolar transistors (HBTs)—may provide transistors, capacitors and thin film resistors. The on-chip capacitors are typically limited to tens of pF, while the on-chip resistors would require a very large die area to realize a resistance in the mega-ohms. Also, due to their large area, such resistors can have a significant parasitic capacitance which can degrade circuit performance. As such, the providing of a time constant on the order of milliseconds using on-chip elements may be impractical or impossible—especially for certain fabrication processes which offer a limited selection of elements.

SUMMARY OF THE INVENTION

A bipolar high impedance element is presented which overcomes the problems noted above. The element, made from a compound semiconductor material, is on-chip, occupies a small area, and provides a high impedance.

The present element comprises a p-n diode made from a compound semiconductor, and circuitry arranged to reverse-bias the diode with a predetermined reverse-bias voltage such that the diode conducts a nearly constant current. The nearly constant current enables the circuitry to employ the diode as a high impedance element. The diode is preferably the base-emitter junction of a transistor made from a compound semiconductor like InP, which requires only a small die area. In this way, an on-chip high impedance element is provided for a fabrication process, such as an HBT process, for which such an element has not previously been available.

The present high impedance element is suitably employed in an active low pass filter design. A p-n diode made from a compound semiconductor is connected between an input signal and an input of an operational amplifier (op amp), with a feedback capacitor connected between the op amp's output and input. The circuit is arranged such that the diode is reverse-biased and thus acts as a high impedance element. This arrangement provides an active low pass filter, with the filter's time constant varying with the impedance of the reverse-biased diode and the capacitance of the feedback capacitor.

Further features and advantages of the invention will be apparent to those skilled in the art from the following detailed description, taken together with the accompanying drawings.

DETAILED DESCRIPTION OF THE INVENTION

The present invention provides an on-chip high impedance element for process technologies that previously lacked such an element, thereby enabling the on-chip implementation of active low pass filters and similar circuits that require such an element.

Figure 1A:
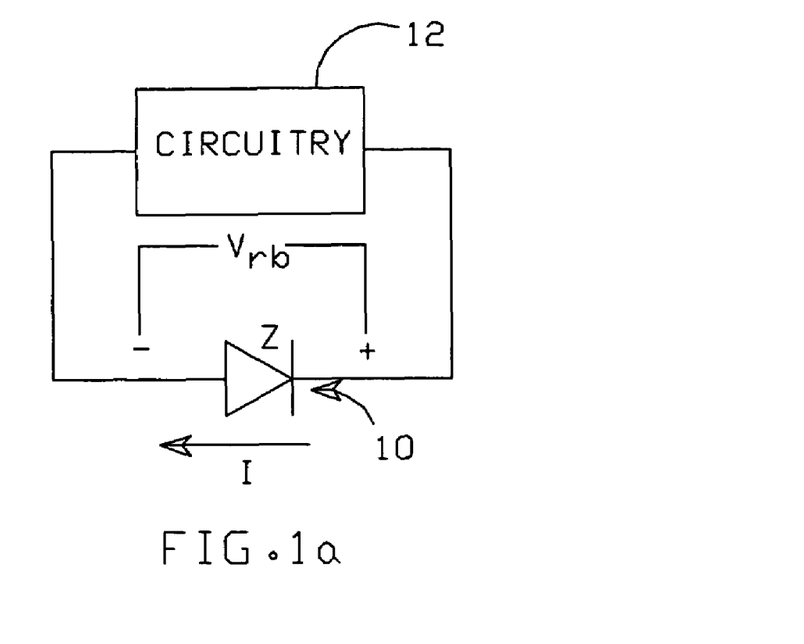
FIG. 1a is a diagram illustrating the principles of the present high impedance element.

The principles of the invention are shown in FIG. 1a. A p-n diode 10, made from a compound semiconductor such as InP, is connected to circuitry 12. Circuitry 12 is arranged to reverse-bias diode 10 with a predetermined reverse-bias voltage $V_{rb}$. This causes the diode to operate at a particular point on the negative slope of its I-V curve, such that it conducts a nearly constant current I.

When so arranged, reverse-biased diode 10 acts as a nearly ideal current source. As such, the diode can be used as a high impedance element having an impedance $Z(=\partial V_{rb}/\partial I)$. The invention requires that circuitry 12 employ diode 10 as a high impedance element. In operation, the DC voltage across the diode is kept relatively constant, and an AC signal to be affected by the high impedance swings within a narrow range on the negative slope of the diode's I-V curve, thereby experiencing a relatively constant impedance Z.

Figure 1B:
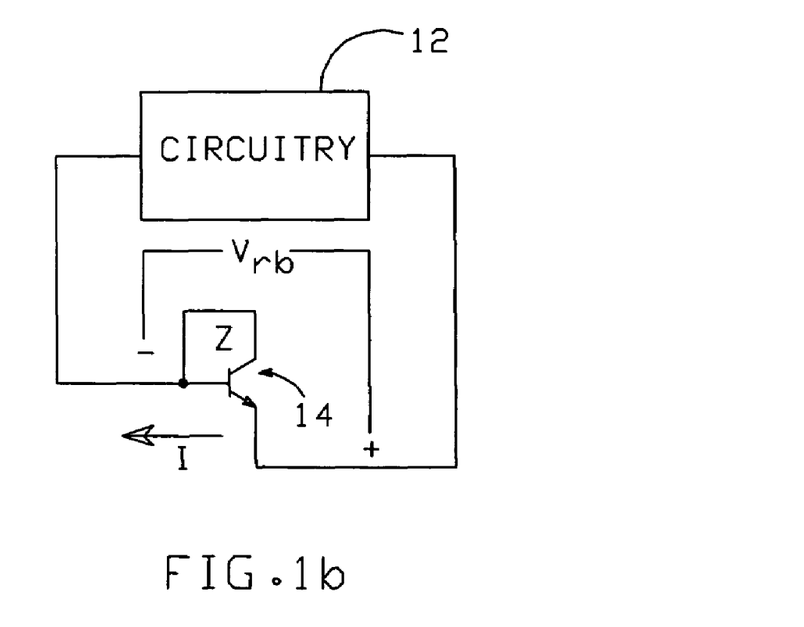
FIG. 1b is a diagram of another embodiment of the present high impedance element.

Diode 10 is preferably implemented with a HBT transistor 14 made from a compound semiconductor such as InP; this is shown in FIG. 1b. Either the base-collector (b-c) junction or the base-emitter (b-e) junction could be used, though the b-e junction is preferred as its I-V characteristics tend to be more consistent from device to device, and it has a smaller temperature coefficient. Fabrication processes for which the invention is well-suited include, for example, the single and double HBT processes (SHBT and DHBT).

Figure 2:
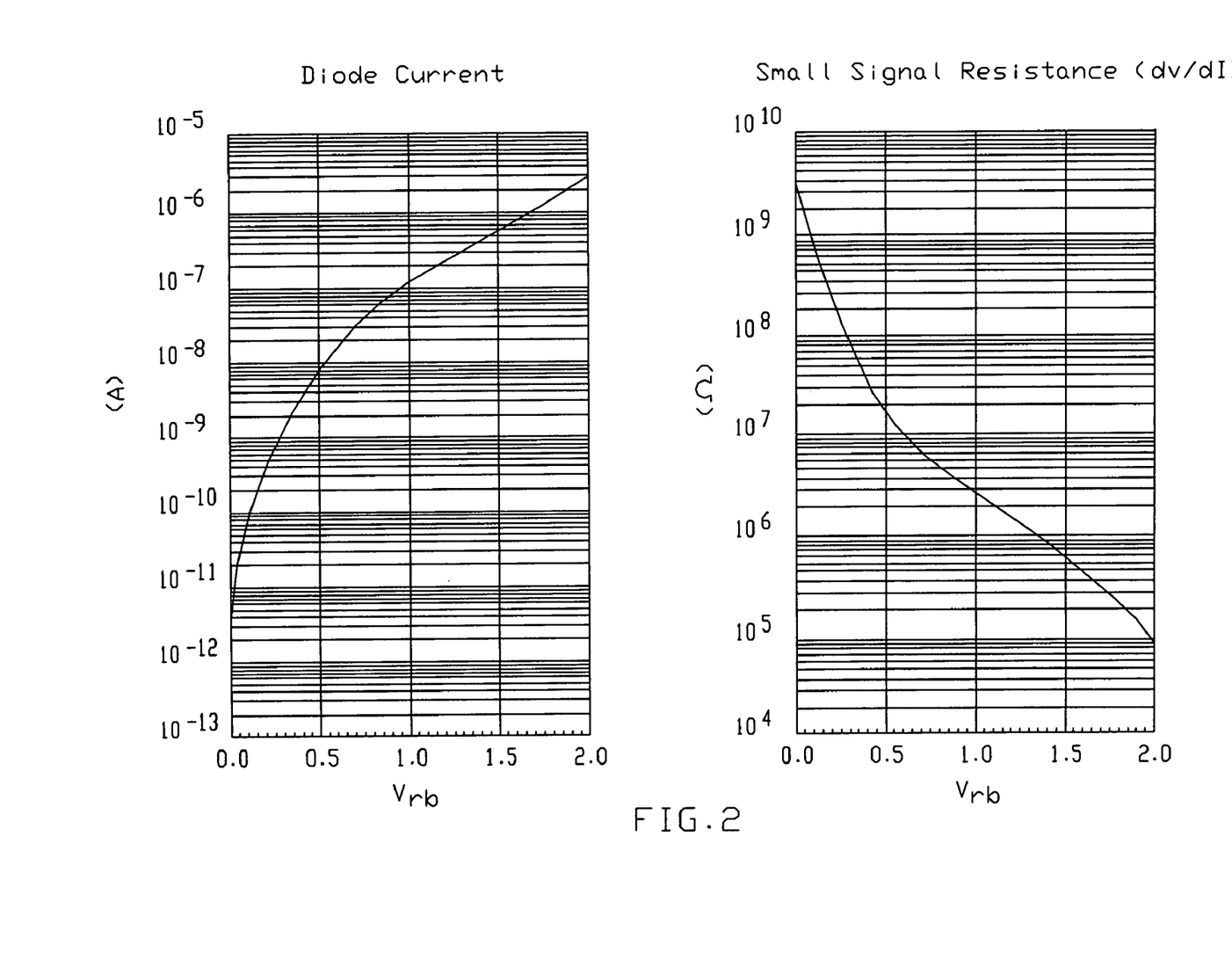
FIG. 2 are graphs depicting reverse-bias voltage vs. current and reverse-bias voltage vs. small signal resistance for the present high impedance element.

FIG. 2 shows two graphs. The graph on the left depicts reverse-bias voltage $V_{rb}$ vs. current I for a high impedance element implemented with the b-e junction of a 1 µm×5 µm HBT transistor. The graph on the right is the derivative of the graph on the left, and depicts $V_{rb}$ vs. small signal resistance for the high impedance element. The graphs demonstrate that at a $V_{rb}$ of about 1 volt, for example, an impedance of about 1 MΩ is achieved.

Figure 3A:
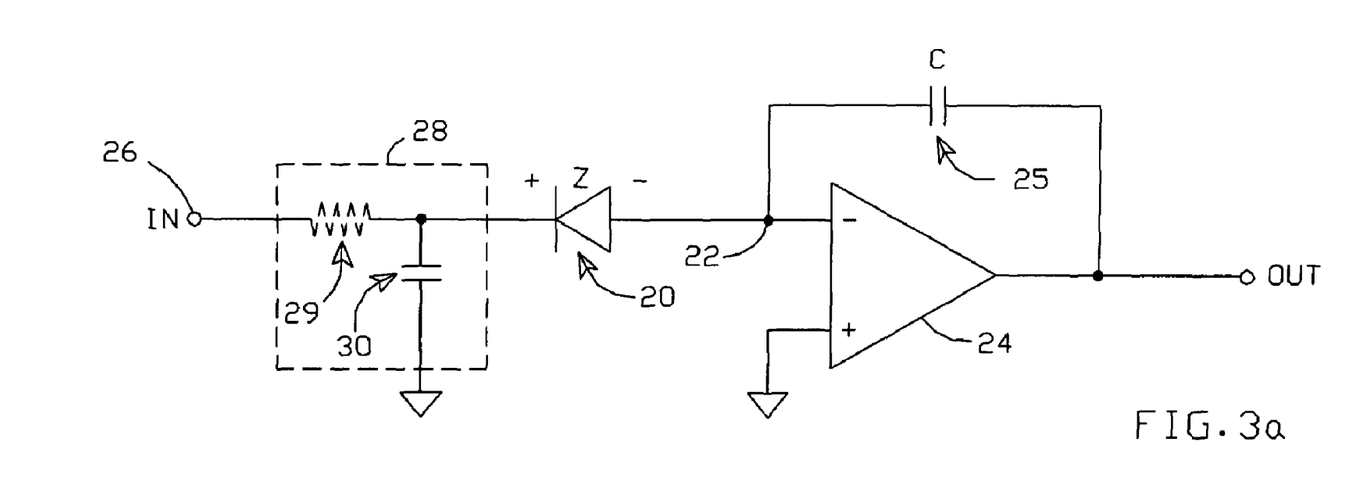
FIG. 3a is a schematic diagram of an active low-pass filter which employs a high impedance element per the present invention.

An active low pass filter which employs the present high impedance element is shown in FIG. 3a. As described above, the high impedance element is a p-n diode 20 made from a compound semiconductor, which is reverse-biased to provide a nearly constant current and thus a high impedance. The anode of diode 20 is connected to a terminal 22 having a high input impedance, such as an input to an op amp 24. The cathode of diode 20 is coupled to an input terminal 26 connected to receive an input signal IN. A feedback capacitor 25 having a capacitance C is connected between the op amp output (OUT) and input 22. The op amp is designed to have a small input bias current that results in diode 20 being reverse-biased. The input bias current may be designed such that diode 20 provides a desired small-signal impedance.

When so arranged, an active low-pass filter is formed. The filter has an associated time constant τ, which is given by:

$$\tau = (Z \| Z_{amp}) * C * (A+1),$$

where Z is the impedance of reverse-biased diode 20, $Z_{amp}$ is the input impedance of op amp input 22, and A is the op amp's voltage gain. The time constant of the filter is set by the dominant pole, which is formed by the impedance of diode 20 and capacitance C, Miller-multiplied by the gain of amplifier 24. This arrangement enables an on-chip low frequency cutoff (3 dB) to be reached that is less than 10 kHz.

The filter preferably includes a prefilter 28, formed, for example, from an R-C network comprising a resistor 29 and a capacitor 30. The prefilter filters the input signal and limits the voltage excursion at the cathode of diode 20, to reduce any non-linear effects from the reverse-voltage-dependent impedance.

Figure 3B:
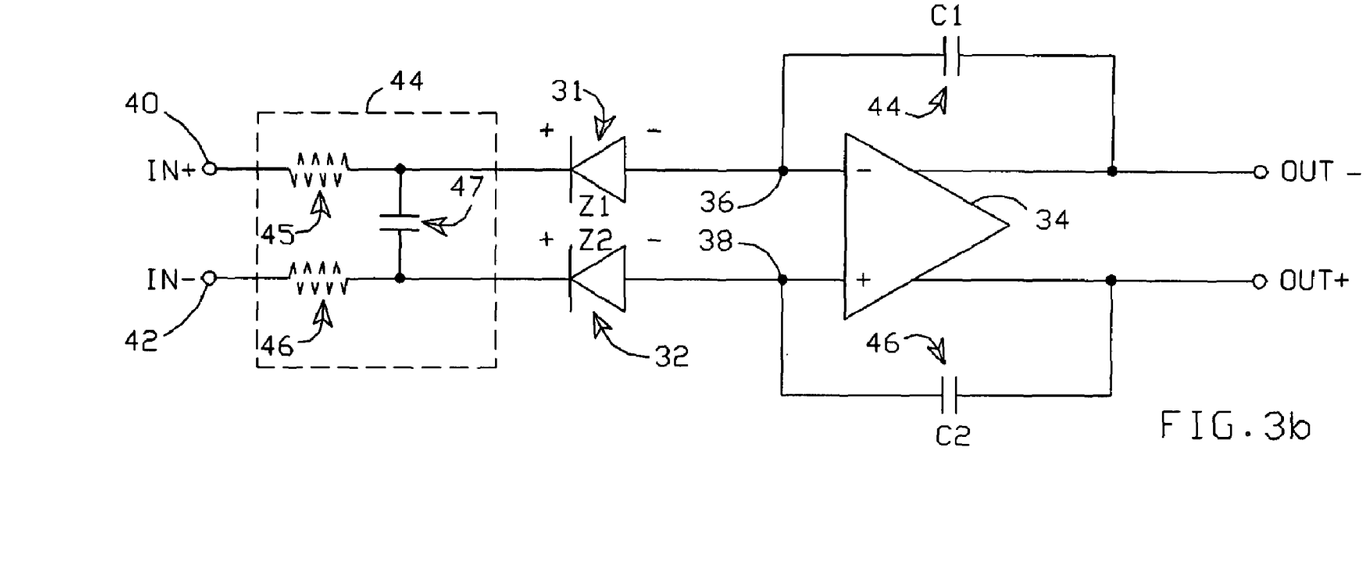
FIG. 3b is a schematic diagram of another embodiment of an active low-pass filter which employs high impedance elements per the present invention.

A differential implementation of an active low pass filter which employs the present high impedance element is shown in FIG. 3b. Here, two p-n diodes 31, 32 made from a compound semiconductor are connected to the inverting and non-inverting inputs of an op amp 34 having non-inverting and inverting outputs, which are connected to differential output terminals OUT− and OUT+, respectively. The anodes of diodes 31 and 32 are connected to the inverting and non-inverting inputs 36, 38, respectively, of op amp 34, and their cathodes are coupled to respective input terminals 40 and 42 which receive a differential input signal IN+ and IN−. A feedback capacitor 44 having a capacitance C1 is connected between op amp output OUT− and input 36, and a feedback capacitor 46 having a capacitance C2 is connected between op amp output OUT+ and input 38.

The small input bias currents of op amp inputs 36 and 38 cause diodes 31 and 32 to be reverse-biased and thus serve as high impedance elements as described above, having impedances Z1 and Z2, respectively. Typically, Z1 would be made equal to Z2 and C1 made equal to C2, such that the filter's time constant τ is given by:

$$\tau = (Z1 \| Z_{amp}) * C1 * (A+1),$$

where $Z_{amp}$ is the input impedance of op amp inputs 36 and 38 and A is the op amp's gain.

As with the filter shown in FIG. 3a, the filter of FIG. 3b preferably includes a prefilter 44, formed, for example, from an R-C network comprising resistors 45 and 46 and a capacitor 47. The prefilter filters the input signal and limits the voltage excursion at the cathodes of diodes 31 and 32, to reduce any non-linear effects from their reverse-voltage-dependent impedances.

Figure 4:
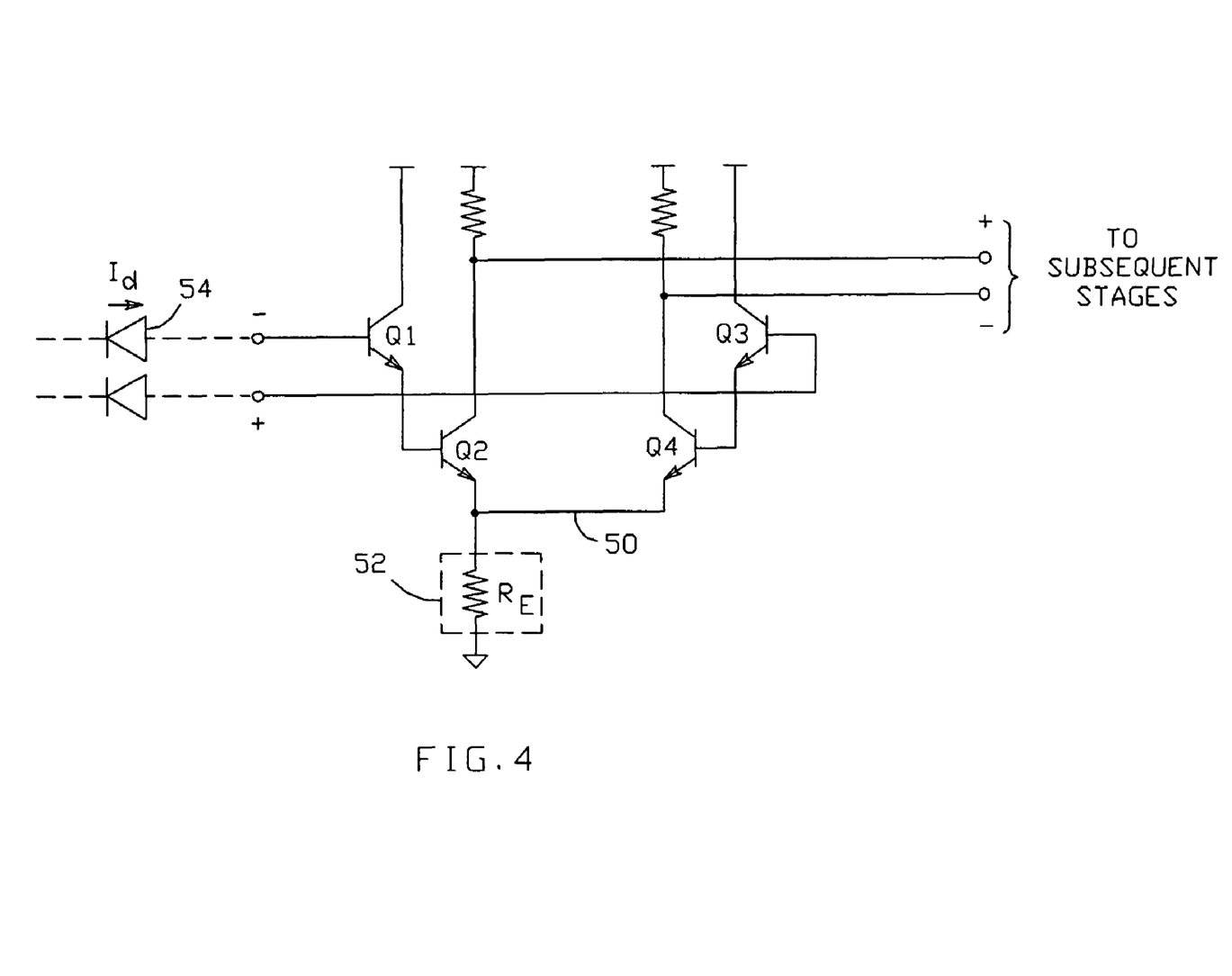
FIG. 4 is a schematic diagram of an op amp input stage as might be used with the active low-pass filter shown in FIGS. 3a and 3b.

To achieve very low input bias currents for the op amp's inverting and non-inverting inputs, the op amp preferably includes an input stage which employs first and second Darlington transistor pairs connected to respective inputs; an exemplary embodiment of such an input stage is shown in FIG. 4. The op amp's inverting input is connected to the base of a bipolar transistor Q1, the emitter of which is connected to the base of a bipolar transistor Q2. The amp's non-inverting input is connected to the base of a transistor Q3, the emitter of which is connected to the base of a transistor Q4. The emitters of Q3 and Q4 are connected together at a node 50. A current source 52 is connected between node 50 and a circuit common point. The Darlington configuration is preferred, as it provides a high input impedance for the inverting and non-inverting inputs, and enables the current provided by current source 52 to be at a practical level.

For example, assume that a current Id of 100 nA is needed in reverse-biased diode 54. Further assume that Q1 and Q2 have respective beta values β1 and β2 of 5 and 10. If Q1's base current is 100 nA, its emitter current will be 100*5+100=600 nA. This is Q2's base current, which then conducts an emitter current of 600*10+600=6.6 µA.

When arranged as shown in FIG. 4, with β1=β2 and β3=β4 and with current source 52 implemented with a resistor having a resistance $R_E$, the op amp has an input impedance $Z_{amp}$ (for a differential input signal) which is given by: $Z_{amp} = (\beta 1 + 1) * (\beta 2 + 1) * 2 * R_E$. Then, an active low pass filter as illustrated in FIGS. 3a and 3b and employing the input stage of FIG. 4 would have a time constant τ given by:

$$\tau = (Z \| Z_{amp}) * C * (A+1) = (Z \| ((\beta 1+1) * (\beta 2+1) * 2R_E)) * C * (A+1),$$

where Z is the impedance of reverse-biased diode 54 and A is the op amp's voltage gain.

Figure 5:
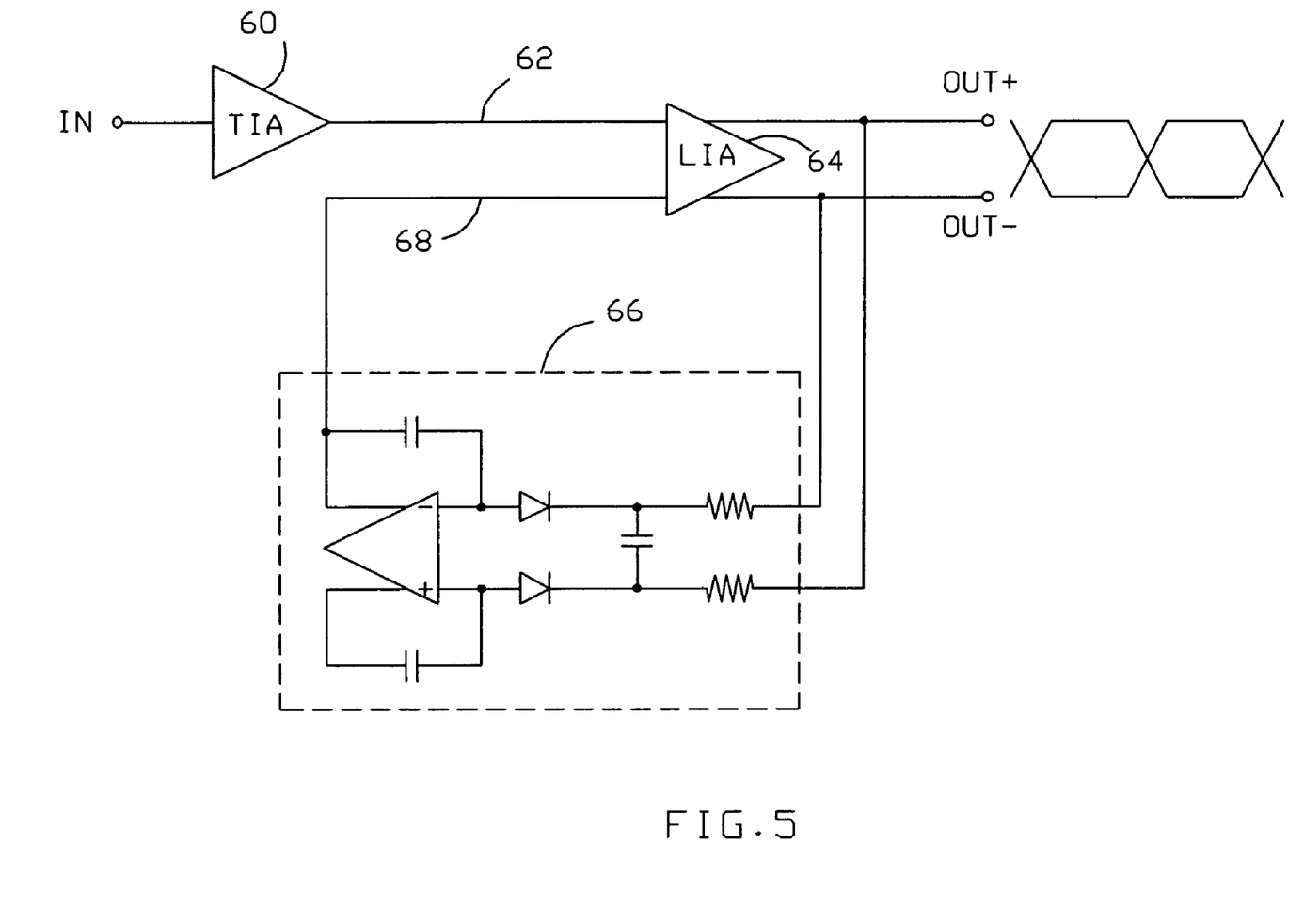
FIG. 5 is a diagram of a differential line driver which employs an active low-pass filter as shown in FIG. 3b.

A low pass filter employing a reverse-biased voltage as described herein is advantageously employed in a receiver circuit as shown in FIG. 5. Here, an input signal IN is applied to a transimpedance amplifier (TIA) 60, which provides a output 62 to a limiting amplifier (LIA) 64; amplifier 64 produces a differential output signal OUT+/OUT−. To ensure that the LIA's outputs are balanced, an active low pass filter 66 as described above is connected across the output lines. The filter effectively calculates the average of the differential output signal from the LIA, and provides a feedback signal 68 to the LIA to achieve balanced outputs.

Note that the present bipolar high impedance element can be used in numerous applications; the active low pass filters of FIGS. 3a and 3b and the receiver circuit shown in FIG. 5 are merely examples. The invention is useful whenever an on-chip high impedance element is needed on a die made with a compound semiconductor fabrication process.

While particular embodiments of the invention have been shown and described, numerous variations and alternate embodiments will occur to those skilled in the art. Accordingly, it is intended that the invention be limited only in terms of the appended claims.

We claim:

1. A bipolar high impedance element, comprising:
   a p-n diode comprising indium phosphide (InP); and
   circuitry arranged to reverse-bias said diode with a predetermined reverse-bias voltage such that said reversed-biased diode conducts a nearly constant predetermined current such that said element provides a known impedance, and further arranged to employ said reversed-biased diode as a high impedance element in said circuitry; said circuitry comprising:

a first input voltage coupled to the cathode side of said diode; and a circuit having an input with a high input impedance which is connected to the anode side of said diode, said circuit arranged such that the voltage at said anode with respect to the voltage at said cathode is sufficient to continuously reverse-bias said diode.

2. The element of claim 1, wherein said circuit input is an inverting or non-inverting input of an operational amplifier.

3. The element of claim 2, wherein the input bias current of said inverting or non-inverting input is selected such that said reversed-biased diode provides a desired small-signal impedance.

4. An active low pass filter, comprising:

a p-n diode comprising a compound semiconductor; and circuitry arranged to reverse-bias said diode with a predetermined reverse-bias voltage such that said reversed-biased diode conducts a nearly constant current, and further arranged to employ said reversed-biased diode as a high impedance element in said circuitry, said circuitry comprising:

a first input voltage coupled to the cathode side of said diode; and an operational amplifier having inverting and non-inverting inputs and an output, the inverting or non-inverting input of said operational amplifier connected to the anode side of said diode at a first node; and a capacitor connected between said operational amplifier output and said first node, said circuitry arranged such that the voltage at said anode with respect to the voltage at said cathode is sufficient to reverse-bias said diode;

such that said circuitry and said reverse-biased diode form an active low pass filter.

5. An active low pass filter, comprising:

a first p-n diode comprising a compound semiconductor;

a second p-n diode comprising a compound semiconductor; and circuitry arranged to reverse-bias said diodes with respective predetermined reverse-bias voltages such that said reversed-biased diodes conduct nearly constant respective currents, and further arranged to employ said reversed-biased diodes as high impedance elements in said circuitry, said circuitry comprising:

a first input voltage coupled to the cathode side of said first diode;

a second input voltage coupled to the cathode side of said second diode; and an operational amplifier having inverting and non-inverting inputs and differential outputs, the anode side of said first diode connected to one of said inverting and non-inverting inputs and the anode side of said second diode connected to the other of said inverting and non-inverting inputs;

a first capacitor connected between one of said differential outputs and one of said inverting and non-inverting inputs; and a second capacitor connected between the other of said differential outputs and the other of said inverting and non-inverting inputs, said circuitry arranged such that the voltages across said diodes is sufficient to reverse-bias said diodes;

such that said circuitry and said reverse-biased diodes form an active low pass filter.

6. An active low pass filter, comprising:

a first input terminal which receives an input voltage;

an operational amplifier having inverting and non-inverting inputs and an output;

a first p-n diode comprising a compound semiconductor, the anode side of said first diode connected to one of said inverting and non-inverting inputs at a first node and the cathode side of said first diode coupled to said first input terminal, said filter arranged such that the voltages across said diode reverse-bias said diode such that it conducts a nearly constant current and functions as a high impedance element having an impedance Z; and a capacitor having a capacitance C connected between said output and said first node, thereby forming an active low-pass filter having a time constant $\tau$ which varies with the Z and C.

7. The filter of claim 6, wherein said first p-n diode comprises the base-emitter junction of a transistor.

8. The filter of claim 7, wherein said transistor comprises indium phosphide (InP).

9. The filter of claim 6, wherein said operational amplifier has an associated gain value A and an input impedance value $Z_{amp}$, and said time constant $\tau$ is given by:

$$\tau=(Z\|Z_{amp})*C*(A+1).$$

10. The filter of claim 6, further comprising:

a first resistor connected between said first input terminal and the cathode of said first diode; and a second capacitor connected between the cathode of said first diode and a circuit common point, said first resistor and said second capacitor forming a prefilter that limits the voltage excursion at the cathode of said first diode.

11. The filter of claim 6, wherein said operational amplifier has differential outputs, said capacitor connected between one of said differential outputs and said first node, further comprising:

a second input terminal which receives an input voltage;

a second p-n diode comprising a compound semiconductor, the anode side of said diode connected to the other of said inverting and non-inverting inputs at a second node and the cathode side of said diode coupled to said second input terminal, said filter arranged such that the voltages across said second diode reverse-bias said second diode such that it conducts a nearly constant current and functions as a high impedance element having an impedance Z2; and a second capacitor having a capacitance C2 connected between the other of said differential outputs and said second node, thereby forming an active low-pass filter having a time constant $\tau$ which varies with the Z, C, Z2 and C2.

12. The filter of claim 11, wherein said operational amplifier has an associated gain value A and an input impedance value $Z_{amp}$, Z=Z2, C=C2, and said time constant $\tau$ is given by:

$$\tau=(Z\|Z_{amp})*C*(A+1).$$

13. The filter of claim 11, further comprising:

a first resistor connected between said first input terminal and the cathode of said first diode;

a second resistor connected between said second input terminal and the cathode of said second diode; and a third capacitor connected between the cathodes of said first and second diodes, said first and second resistors and said third capacitor forming a prefilter that limits the voltage excursion at the cathodes of said first and second diodes.

14. The filter of claim 6, wherein said operational amplifier comprises an input stage which includes first and second Darlington transistor pairs, each of said Darlington transistor pairs connected to a respective one of said inverting and non-inverting inputs to provide a high input impedance for each of said inverting and non-inverting inputs.

15. The filter of claim 14, wherein said operational amplifier has an associated gain value A and an input impedance value $Z_{amp}$, and said time constant τ is given by: τ=(Z||$Z_{amp}$)*C*(A+1), and wherein said first Darlington transistor pair comprises:
   a first transistor Q1, and
   a second transistor Q2 connected in a Darlington configuration and having respective beta values β1 and β2;
   said second Darlington transistor pair comprises:
   a third transistor Q3, and
   a fourth transistor Q4 connected in a Darlington configuration and having respective beta values β3 and β4 with β1=β2 and β3=β4, the emitters of Q3 and Q4 connected to a second node;
   said operational amplifier further comprising a resistor having a resistance $R_E$ connected between said second node and a circuit common point, such that $Z_{amp}$ is given by:

$Z_{amp}=(β1+1)*(β2+1)*2R_E$.

16. An active low pass filter, comprising:
   first and second input terminals which receives a differential input signal;
   an operational amplifier having inverting and non-inverting inputs and differential outputs;
   a first bipolar transistor comprising a compound semiconductor, said first transistor's base-emitter junction providing a first diode, the anode side of said first diode connected to one of said inverting and non-inverting inputs at a first node and the cathode side of said first diode coupled to said first input terminal, said filter arranged such that the voltages across said first diode reverse-bias said first diode such that it conducts a nearly constant current and functions as a high impedance element having an impedance Z1;
   a second bipolar transistor comprising a compound semiconductor, said second transistor's base-emitter junction providing a second diode, the anode side of said second diode connected to the other of said inverting and non-inverting inputs at a second node and the cathode side of said second diode coupled to said second input terminal, said filter arranged such that the voltages across said second diode reverse-bias said second diode such that it conducts a nearly constant current and functions as a high impedance element having an impedance Z2;
   a first capacitor having a capacitance C1 connected between said one of said differential outputs and said first node; and
   a second capacitor having a capacitance C2 connected between the other of said differential outputs and said second node, thereby forming an active low-pass filter having a time constant τ which varies with the Z1, Z2, C1 and C2.

17. The filter of claim 16, wherein said transistors comprise indium phosphide (InP).

18. The filter of claim 16, further comprising:
   a first resistor connected between said first input terminal and the cathode of said first diode;
   a second resistor connected between said second input terminal and the cathode of said second diode; and
   a third capacitor connected between the cathodes of said first and second diodes, said first and second resistors and said third capacitor forming a prefilter that limits the voltage excursion at the cathodes of said first and second diodes.

19. The filter of claim 16, wherein said operational amplifier has an associated gain value A and an input impedance value $Z_{amp}$, Z1=Z2, C1=C2, and said time constant τ is given by:

τ=(Z1||$Z_{amp}$)*C1*(A+1).

20. The filter of claim 19, wherein said operational amplifier comprises an input stage which includes first and second Darlington transistor pairs, each of said Darlington transistor pairs connected to a respective one of said inverting and non-inverting inputs to provide a high input impedance for each of said inverting and non-inverting inputs.

21. The filter of claim 20, wherein said first Darlington transistor pair comprises:
   a first transistor Q1, and
   a second transistor Q2 connected in a Darlington configuration and having respective beta values β1 and β2;
   said second Darlington transistor pair comprises:
   a third transistor Q3, and
   a fourth transistor Q4 connected in a Darlington configuration and having respective beta values β3 and β4 with β1=β2 and β3=β4, the emitters of Q3 and Q4 connected to a third node;
   said operational amplifier further comprising a resistor having a resistance $R_E$ connected between said third node and a circuit common point, such that $Z_{amp}$ is given by:

$Z_{amp}=(β1+1)*(β2+1)*2R_E$.

22. A receiver circuit, comprising:
   an active low pass filter, comprising:
      first and second input terminals which receive a differential input signal;
      an operational amplifier having inverting and non-inverting inputs and differential outputs;
      a first bipolar transistor comprising a compound semiconductor, said first transistor's base-emitter junction providing a first diode, the anode side of said first diode connected to one of said inverting and non-inverting inputs at a first node and the cathode side of said first diode coupled to said first input terminal, said filter arranged such that the voltages across said first diode reverse-bias said first diode such that it conducts a nearly constant current and functions as a high impedance element having an impedance Z1;
      a second bipolar transistor comprising a compound semiconductor, said second transistor's base-emitter junction providing a second diode, the anode side of said second diode connected to the other of said inverting and non-inverting inputs at a second node and the cathode side of said second diode coupled to said second input terminal, said filter arranged such that the voltages across said second diode reverse-bias said second diode such that it conducts a nearly constant current and functions as a high impedance element having an impedance Z2;
      a first capacitor having a capacitance C1 connected between said one of said differential outputs and said first node; and
      a second capacitor having a capacitance C2 connected between the other of said differential outputs and said second node, thereby forming an active low-pass filter having a time constant τ which varies with the Z1, Z2, C1 and C2;

a transimpedance amplifier (TIA) which receives an input signal and produces an output that varies with said input signal; and a limiting amplifier (LIA) which receives said TIA output and a feedback signal and produces differential line driver output signals in response, said first and second input terminals connected to respective ones of said line driver output signals, said active low pass filter arranged to provide said feedback signal to said LIA such that said feedback signal varies with the average of the line driver output signals from the LIA, such that the differential outputs of said LIA are balanced.

* * * * *